United States Patent [19]

Cann

[11] Patent Number: 4,495,399

[45] Date of Patent: Jan. 22, 1985

[54] MICRO-ARC MILLING OF METALLIC AND NON-METALLIC SUBSTRATES

[76] Inventor: Gordon L. Cann, 17751-F Skypark East, Irvine, Calif. 92714

[21] Appl. No.: 354,546

[22] Filed: Mar. 4, 1982

Related U.S. Application Data

[63] Continuation-in-part of Ser. No. 247,770, Mar. 26, 1981, Pat. No. 4,404,456.

[51] Int. Cl.³ .................................................. B23K 9/00
[52] U.S. Cl. ........................ 219/121 PY; 219/121 PQ; 219/121 PR; 219/121 PH; 219/68; 29/584
[58] Field of Search ................... 219/121 PQ, 121 PY, 219/121 PC, 121 PH, 121 PO, 74, 75, 68, 69 R, 384, 121 PR; 29/584

[56] References Cited

U.S. PATENT DOCUMENTS

| | | |
|---|---|---|
| 3,360,398 | 12/1967 | Garibotti . |
| 3,645,581 | 2/1972 | Lasch, Jr. et al. . |
| 3,668,028 | 6/1972 | Short . |
| 3,820,994 | 6/1974 | Lindberg et al. . |
| 3,995,186 | 11/1976 | Kaminsky et al. . |
| 4,151,034 | 4/1979 | Yamamoto et al. . |
| 4,277,304 | 7/1981 | Horiike et al. . |
| 4,280,041 | 7/1981 | Kiessling et al. . |

Primary Examiner—M. H. Paschall
Attorney, Agent, or Firm—Sherman & Shalloway

[57] ABSTRACT

By using a controlled arc-heated gas flow, material may be milled away from a substrate. By controlling the size of a gas flow aperture as well as other variables such as gas flow and arc current, small holes can be drilled into the substrate. Typically, these holes would have a diameter between 0.025 mm and 0.125 mm.

In one embodiment, an arc made between an anode and cathode is placed above the work. A gas vortex is produced and is caused to pass through the arc, with the holes being drilled by the heated high-energy gas. Alternatively, the work may be used as the anode, with the gas flow carrying away material heated at the arc attachment point of the anode.

The use of the arc-generated plasma gas vortex is particularly advantageous in the milling of multi-layer circuit boards.

29 Claims, 7 Drawing Figures

MICRO-ARC MILLING OF METALLIC AND NON-METALLIC SUBSTRATES

CROSS-REFERENCE TO RELATED APPLICATION

This is a continuation-in-part of my previous application, Ser. No. 247,770 (Mar. 26, 1981), now U.S. Pat. No. 4,404,456 the entire specification and drawings of which are hereby incorporated by reference.

BACKGROUND OF THE INVENTION

1. Field of the Invention

This invention relates to the use of a plasma gas stream to mill materials. Particularly, the invention relates to the use of the plasma to drill small holes, such as those used in printed circuit boards, including multi-layer printed circuit boards.

In the formation of printed circuit boards, it is often desirable to mill holes having a size smaller than that obtainable by using mechanical milling techniques such as a rotating tool bit. By carefully controlling the size of the holes, it is possible to reduce the size of micro-circuits, particularly when the micro-circuits are produced with multi-layer circuit technology.

The drilling of small holes is expected to be important in the fabrication of mechanical components which must be made to precision tolerances. Accordingly, this invention will be used to mill a wide variety of materials for a wide variety of applications in addition to the Kapton (TM, E. I. du Pont de Nemours & Co.) substrates of printed circuit boards.

2. Description of the Prior Art

Various techniques have been advanced for milling through conductive and insulative substrates in order to create via holes and the like. The simplest technique involves mechanical milling. The primary difficulty with this technique is the size limitation, particularly with respect to the minimum diameter of the hole which may be drilled or otherwise milled away. It is often difficult, particularly in multi-layered devices, to ascertain that a mechanically-drilled hole is smooth enough (with no splintered conductors) to insure that the layers are maintained electrically separate except for where the desired connections are to be made.

In one prior art technique, using an electron beam, the device to be etched is placed in a high vacuum and a beam of electrons is directed to the site to be etched. In addition to the necessity of providing a sizable vacuum chamber, ion etching is fairly time consuming. Because of the desirability of increasing the number of operations which can be performed with one pump down, large turntables or other coonveyer devices are used to feed sequential work pieces to a target area in the electron beam apparatus. These turntables require either precise guidance or precise alignment of the substrates to be drilled. This is usually accomplished by a robot. This technique has a disadvantage of being time consuming in its operation.

An ion etching technique has been developed which uses reactive gas at low pressures. The gas is energized into a plasma by R.F. energy. An ion beam is then formed by magnetic fields which cause the gas molecules to form an ion beam. The ion beam passes through a mask, after which it accomplishes a fine etch on a circuit device. Gas plasma devices have been developed in order to provide an etching of various films, such as polycrystaline silicon. In these devices, energy is used to produce a plasma which is then used to etch a workpiece.

Other techniques for milling include various chemical and photo-chemical etching techniques. These techniques are usually limited to the etching of metallic substrates. In the case of multi-layer circuits, it is necessary to sequentially etch and dissolve each of several of the plural layers, often after protecting the upper layers which have already been etched in previous steps. Additionally, chemical etching is usually a fairly slow, as well as tedious, technique, thereby raising the cost of fabrication of multi-layer miniature circuit boards. Since multi-layer circuit boards are used to reduce the necessity of hand wiring electronic circuits and to increase the level of automation in assembly, it is counterproductive to require that elaborate or time-consuming techniques be used in the fabrication of such multi-layer circuit boards.

SUMMARY OF THE INVENTION

It is accordingly an object of the present invention to provide a means for milling fine holes in substrates, the holes being of the magnitude of 0.125 mm to 0.025 mm or less. These holes would be drilled in a controllable fashion to a controlled depth so as to provide the desired dimensional characteristics for the holes. While it is a primary object to provide these holes in devices such as multi-layered circuit boards, it is also an object to provide a technique which can be used to drill such holes for other applications, as for example, jet printer heads.

It is a further object to provide a device which can drill such small diameter holes in multi-layered devices, having metallic or metalized layers alternating with insulative layers. It is a further object of the invention to provide a milling device which can provide such holes in multi-layer circuit boards having layers of metal separated by layers of polyimide resin such as Kapton TM.

Accordingly, in one aspect of the invention, a method is provided for drilling holes in substrates by using an arc and a gas vortex. The gas vortex is caused to flow over an aperture in an anode. An arc is established between the cathode and an anode, and the anode is placed over the substrate to be milled. By causing the vortex to flow over the aperture, the vortex enters the aperture and extends below the aperture toward the substrate. The arc heats the gases in the vortex which, in turn, decompose or vaporize the material in the substrate. Since the vortex is generated above the aperture and extends through the aperture, the arc-heated gases, as they impinge upon the substrate, are limited in diameter to the diameter of the aperture.

The aperture may be formed in the anode by forming a controlled arc between the cathode and the anode when a gas vortex is simultaneously being maintained. Alternatively, the anode may be the first layer of a substance to be milled, with the vortex being formed over the anode at a prescribed location for the milling.

In a further aspect of the invention, an apparatus is provided which accomplishes the above milling process. The apparatus comprises an anode and a cathode, as well as a vortex generator for generating a vortex over an aperture in the anode. A power supply permits the arc to be started and maintained in a controlled fashion, with a timer controlling milling penetration.

DESCRIPTION OF THE PREFERRED EMBODIMENTS

Figure 1:
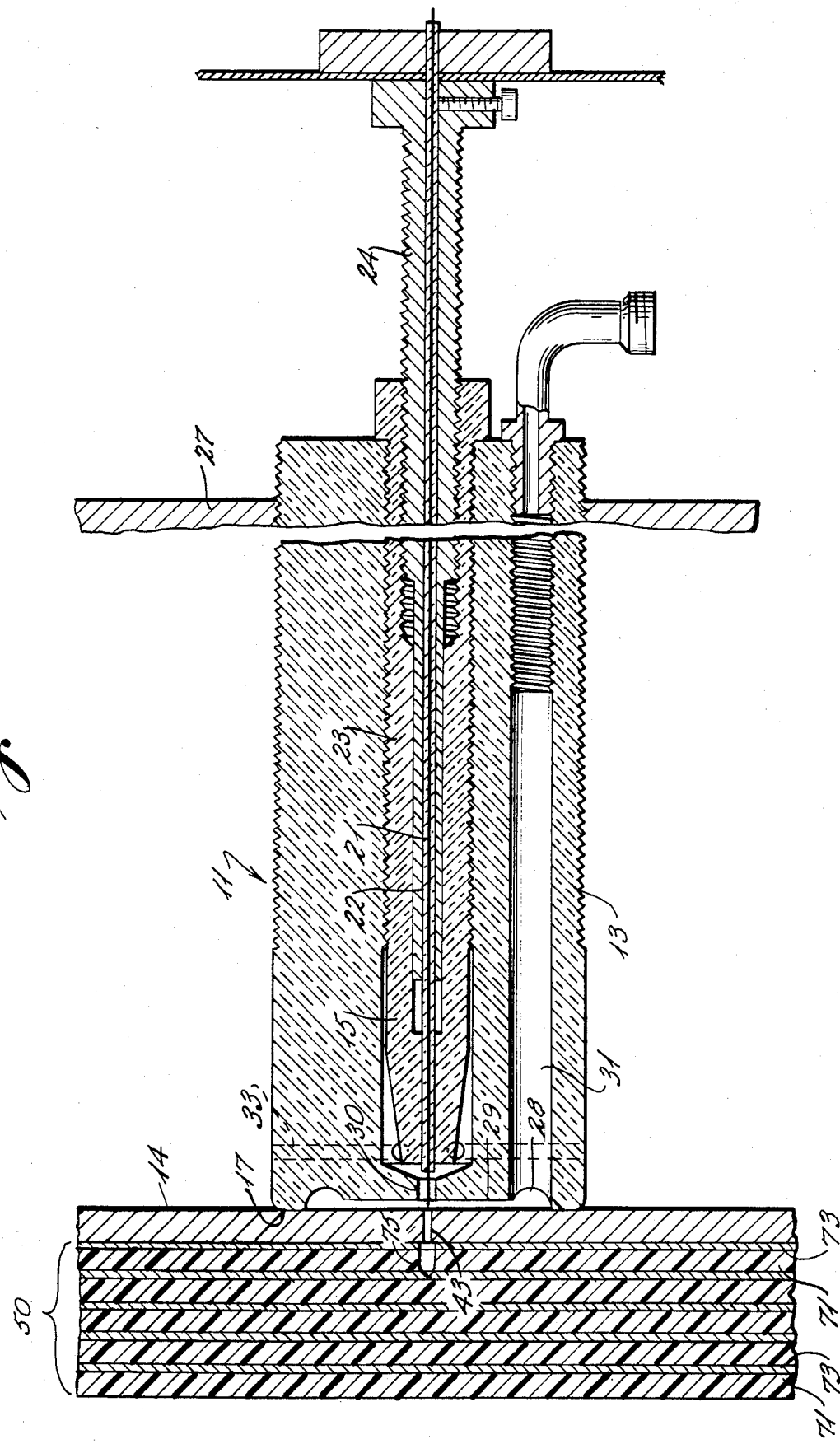
FIG. 1 shows an arc plasma generator according to the invention having just milled a hole in a multi-layer circuit in accordance with the preferred embodiment of the invention.

Referring to FIG. 1, a cathode head 11 comprises a cathode body 13 and an anode plate 14. A cathode cartridge 15 is inserted into the cathode body.

The cathode body 13 is preferably formed of a ceramic such as boron nitride and comprises a plate portion 17 which, in operation, is placed against the anode 14 and positions the cathode head 11 against the anode 14. The cathode cartridge 15 comprises a cathode rod 21 insulated by an alumina tube 22 and an additional ceramic housing 23 (only partially shown) which forms the housing of the cathode cartridge 15. The housing 23 is preferably also made of boron nitride. The cathode rod 21 and alumina tube 22 are held in place by passing the rod entirely through a screw 24. The screw 24 is in turn threaded into the cathode housing 23.

Figure 2:
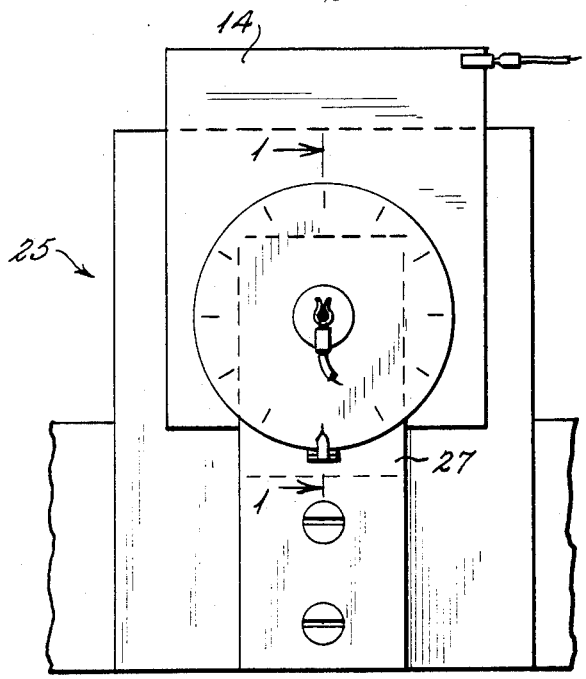
FIGS. 2-3 are front and side views showing the plasma generator of FIG. 1 mounted on a jig.
Figure 3:
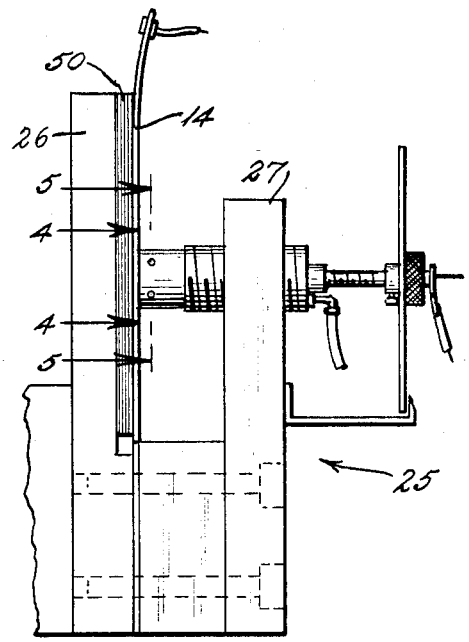

Referring to FIGS. 2 and 3, the cathode head 11 is mounted in a jig 25. The jig 25 comprises a work holding section 26 and a cathode body support 27 in which the cathode body 13 is held. The anode 14 is supported between the work (such as circuit board 50 to be described infra) and the plate portion 17. The jig 25 stabilizes the anode 14 against the work by causing the plate portion 17 of the cathode body 13 to press the anode 14 against the work. Alignment pins (not shown) establish the work in position for proper alignment of holes to be milled by the apparatus.

Figure 4:
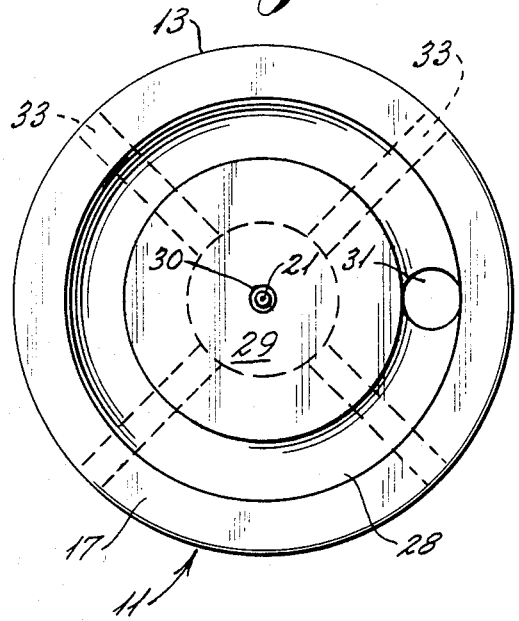
FIGS. 4-5 are sectional views of a vortex-forming plate, taken along lines 4—4 and 5—5 of FIG. 3, respectively.
Figure 5:
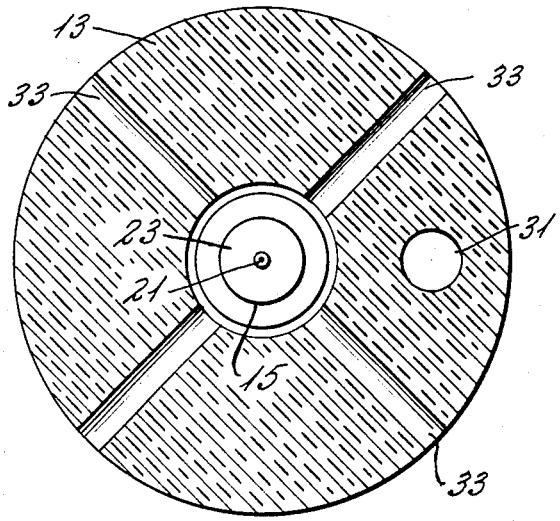

The plate portion 17 is shown in detail in FIGS. 4-5 and directs gas flow to promote the formation of a gas vortex. An outer raised portion 28 promotes a circumferential gas flow, with gas passing under a flat raised portion 29 to a port 30.

One or more gas supply tubes 31 facilitate the supply of a gas which forms a vortex below the plate portion 17 and above the anode 14. Gas return lines 33 are provided to permit an exhausting of gas from between the cathode head 11 and the anode 14, thereby promoting a vortex. The cathode rod 21 extends through a port 30 formed in the plate portion 17 so that the cathode rod 21 is within close proximity of the anode 14, but not touching the anode, so that an arc attachment point will occur adjacent to or reasonably close to the port 30.

A plasma directing aperture 43 is formed in the anode 14 with the aid of a controlled arc, as described in the U.S. Patent Specification, Ser. No. 247,770 (Mar. 26, 1981), that specification being incorporated by reference. The use of the controlled microarc, as described in the above-mentioned patent document, facilitates the fabrication of the plasma-directing aperture 43 so that the aperture 43 has a limited diameter, as will be described.

Figure 6:
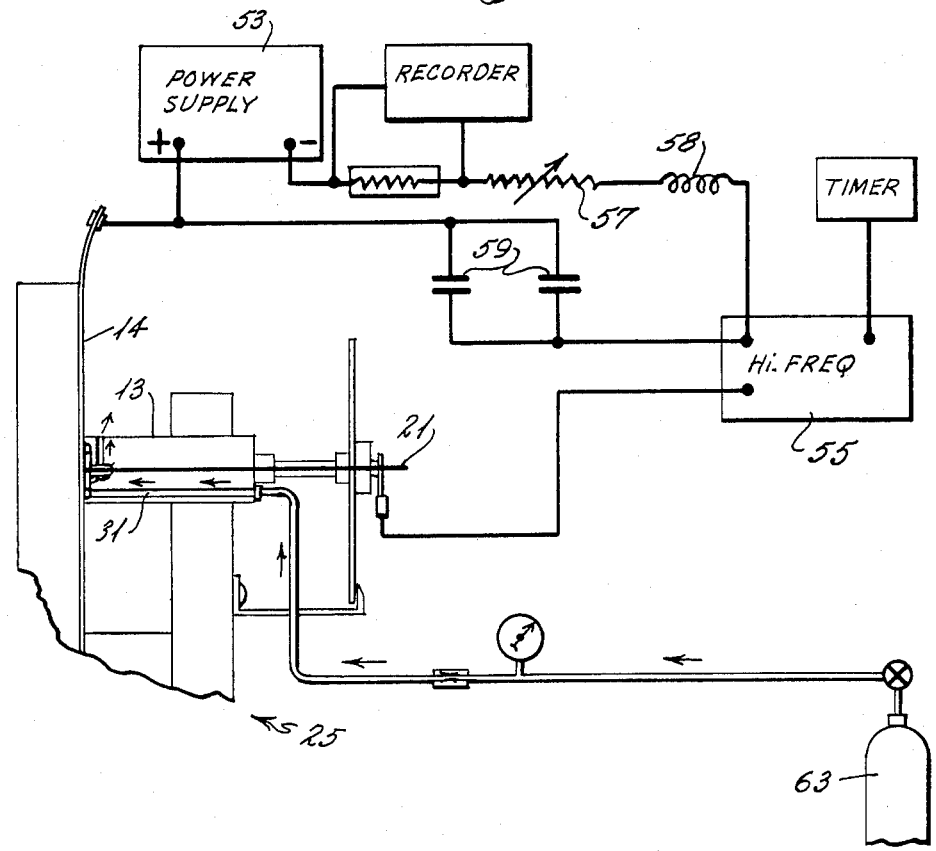
FIG. 6 shows the plasma generating assembly of FIG. 1 connected to an appropriate power supply.

Referring to FIGS. 2-3, the cathode is mounted in the jig 25 which also holds the anode plate 14, behind which is a printed circuit board 50 as shown in FIG. 1. As shown in FIG. 6, the anode 14 and cathode 21 are electrically connected to a power supply which includes the DC voltage generator 53 and an RF current generator 55. The DC voltage generator 53 passes current through a bank of resistors 57 in order that maximum current output may be controlled. A choke 58 prevents AC current generated by the RF generator from passing through the DC generator, and a pair of capacitors 59 permits the RF generator 55 to be used to switch DC power to the anode 14 and cathode 21 when the RF generator 55 is also connected across the anode 14 and the cathode 21.

A gas 63 is provided and is connected to the gas vortex supply tube 31 of the cathode body 13. An exhaust (not shown) is connected to the gas return line to enable the products of vaporization or of decomposition of the material to be properly disposed of.

Nitrogen has been found to be a suitable gas for the gas supply 63. This is because nitrogen has a high dissociation energy which allows a much smaller diameter arc for the same current and pressure than do some of the inert gases such as argon. Also, nitrogen has a reactive effect on some or all of the materials on the workpiece such as the printed circuit board 50. Despite this, it is alternatively possible to supply an inert gas such as argon or a gas such as $H_2$, provided that the gas can be safely passed through the arc in a vortex.

OPERATION

Referring again to FIG. 1, the arc-heated gas flow is typically used to drill holes in multi-layer printed circuit boards such as board 50. Typically, these boards comprise layers of a polyimide such as Kapton (TM, E I du Pont de Nemours) 71, the layers of Kapton 71 alternated with metalization layers 73 which typically comprise copper or aluminum, although lead-tin solder, semiconductor materials or other group 4b metals are also common. A hole 75 of a specified depth, therefore, advantageously penetrates some, but not necessarily all of the layers 71, 73. In order to bore such a hole 75, a vortex is created by a gas which is provided from the gas supply 63 to the gas vortex supply tubes 41. An arc in initiated between the cathode rod 21 and the anode 14 which heats the vortex. The vortex is centered over the aperture 53 and the arc-heated gases in the vortex penetate the aperture 43 to impinge upon the printed circuit board 50.

The portion of the metalizaiton layers 73 upon which the vortex impinges is melted and vaporized. The vaporized components of the metalization layers 73 are removed by gas returning from the vortex to exit through the gas return line 33. The portion of the Kapton layers 71 upon which the vortex impinges is decomposed, with the products of decomposition likewise being carried away by the vortex.

By controlling the gas flow and the arc current, the amount of heated gas impinging upon the surface of the printed circuit board 50 is accurately controlled. Therefore, empherical or calculated data may be obtained to determine the length of time necessary to penetrate a desired number of layers 71, 73 of the printed circuit board 50. Typically, it is necessary to at least expose a particular metalization layer 73 while not penetrating the next Kapton TM layer enough to expose the next metalization layer. The hole 75 may be left as such, usually existing as a via hole, or the printed circuit board may be moved with respect to the electrodes 14, 21 to create various grooved patterns in the multi-layer board. It can be seen that, since the vortex is extended through aperture 43, the diameter of the hole 75 created by the impingement of the vortex would be approximately that of the aperture 43.

In order to calculate the amount of current to be supplied by the voltage generator 53, it is necessary to determine a number of factors relating to the energy transfer of power dissipated through the arc, converted to heat and conducted through the item to be etched. When it is desired to etch a particular item according to the invention, it is first necessary to measure the size of that portion of the item to be etched and assign to it the following quantities:

1. temperature necessary to cause that material to vaporize or decompose during the etching process;
2. the mass of that material which is to be etched away from the item;
3. the average surface area of the material that will be radiating a given amount of energy when heated;
4. the cross-sectional areas through which heat is conducted away from that portion of the material to be etched; and
5. the effective conduction lengths=average lengths over which the heat is to be conducted.

It is then necessary to determine the amount of heat energy which is radiated from the arc to the material to be etched. This enables one to calculate the amount of power necessary to be dissipated through the arc in order to apply a certain amount of heat to the item to be etched. By controlling the amount of heat applied to the material to be etched and the duration of time that the heat is applied, it is possible to control the speed at which the material is etched from the item with a high degree of accuracy. It is, therefore, significant that the arc current be controlled to a pre-determined value, within a pre-determined tolerance and that the time that the arc current is applied is controlled to a pre-determined value, with a pre-determined tolerance. In a preferred embodiment, the arc current is controlled to ±1% of an optimum value, while the time is controlled to within ±2% of a calculated value.

OPERATION TO FORM AN APERTURE IN AN ANODE PLATE

It is anticipated that the cathode may be useful in creating its own aperture 43 in the anode plate 14. By precisely controlling various arc parameters as described in the above-mentioned patent specification, Ser. No. 247,770 (Mar. 26, 1981), the vortex formed by the gas supply 63 entering the gas vortex supply tube 31 aids in the formation of the aperture 43. Since it is desired that the electrodes 14, 21 do not erode away, it is advantageous to form these of a material having a low vapor pressure at high temperatures, such as molybdenum or tungsten.

It is alternatively possible to etch a conductive material by using the conductive material as the cathode 14. In this case, the arc directly vaporizes the metal with the cooperation of the arc-heated gas. The vaporized metal is, of course, carried off by the arc-heated gas vortex.

In order to maintain a fairly constant power output, most of the current is provided by the DC voltage generator 53. The RF current generator 55 insures that there is a constant flow of current between the cathode and anode so that the timed arc can provide repeatable results. Since the amount of the time that the RF current generator is "on" controls the duration of the arc, it is possible to connect a timer 81 directly to the RF current generator.

While a preferred arrangement has been shown and described, it is possible to vary the details of operation within the scope of this invention. For example, a reversal of the cathode and anode by reversing the polarity of connections to elements 14 and 21 may be possible and, in certain cases, advantageous. While the milling of holes in multi-layer circuit boards has been described, the same techniques may be used to manufacture ink jet heads, to manufacture products out of green ceramic materials or to make precicision cuts in materials of various types, while still using the present invention.

Figure 7:
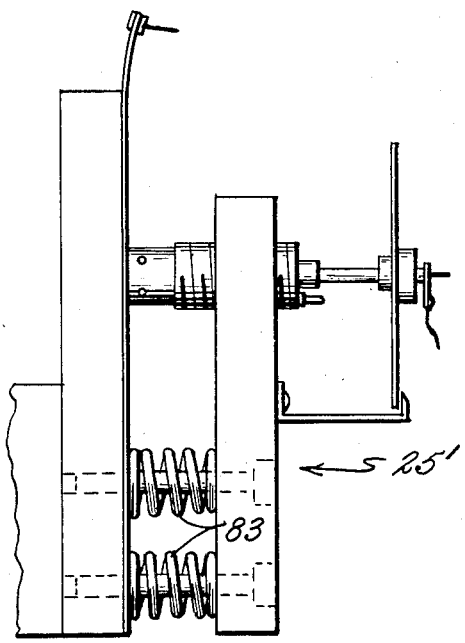
FIG. 7 shows an alternate embodiment of a jig used with the invention.

It is further anticipated that changes may be made to the present invention as large scale production becomes more practical. For example, if the jig arrangement of FIGS. 1 and 2 prove to be commercially successful, it may be desired to modify the clamp, as shown in FIG. 7. In that embodiment a jig 25' is provided with springs 83. This permits quick replacement of work under the anode 14 without making adjustments in the jig 25' unless successive work pieces have different dimensions.

I claim:

1. A method for milling materials from a work article in which the materials are removed by a micro-arc-heated gas plasma comprising:
   (a) placing a cathode having a longitudinal axis in the proximity of the material to be milled;
   (b) establishing an anode adjacent the cathode;
   (c) providing an electric potential across the anode and cathode, said potential being sufficient to maintain an arc at less than 10 amperes;
   (d) directing a gaseous fluid within a substantially confined chamber in a controlled flow pattern substantially radially toward the material to be removed while maintaining said potential between the cathode and anode for a predetermined time period; and
   (e) passing the gaseous fluid from said work article toward the cathode through a vortex flow to remove material from said proximity.

2. The method of claim 1 wherein the cathode is comprised of a refractory metal.

3. The method of claim 1 wherein the fluid is a gas selected from the group consisting mainly, but not limited to nitrogen and the inert gas elements.

4. The method of claim 1 wherein the fluid chemically reacts with the materials to be removed.

5. The method of claim 1 wherein the cathode is comprised of a refractory metal and the anode is a portion of said article.

6. A method of claim 5 wherein, prior to the milling, the anode is contiguous and homogenous with the material to be removed.

7. A method of claim 5 wherein the material to be removed is a metal.

8. A method of claim 5 wherein the material to be removed is a semiconductor.

9. The method of claim 1 wherein:
   (a) the anode is distinct from the article;
   (b) the arc is maintained without contacting the article; and
   (c) said gas vortex directed toward the article changes the material to be removed away from a solid physical state, with the vortex flow removing said material changed away from a solid physical state.

10. The method of claim 1 wherein the gas removes the material from the article by the fluid being elevated in temperature by the arc and being directed toward the material at a velocity which is at least approximately Mach 1, as measured at an ambient temperature, said material being abraded away from the article by the fluid.

11. The method of claim 1 wherein the arc is initiated by impressing radio frequency current across the cathode and the anode.

12. The method of claim 1 wherein the arc is initiated by providing an initial high voltage between the cathode and the anode.

13. The method of claim 9 wherein said vortex surrounds the arc.

14. The method of claim 9 wherein the article is a composite of at least one insulator and at least one conductor.

15. The method of claim 14 wherein the article is a multi-layer printed circuit board.

16. The method of claims 9 or 14 wherein the article is a jet printer.

17. The method of claim 1 wherein the article is single or multi layer requiring the milling of small precision holes.

18. A method for milling materials from a work article using a micro-arc-heated gas, the method comprising:
 (a) extending an arc between an anode and a cathode through a predetermined gap spacing;
 (b) providing an electric potential across the anode and cathode, said potential being sufficient to maintain an arc at less than 10 amperes;
 (c) forming an aperture in the anode with said arc, the aperture having a predetermined diameter;
 (d) placing the anode adjacent to said work article;
 (e) directing a gaseous fluid within a substantially confined chamber in a controlled flow pattern substantially radially toward the material to be removed while maintaining an arc between the anode and the cathode;
 (f) passing said gaseous fluid from the anode toward the cathode through a vortex flow;
 (g) controlling arc current to a predetermined tolerance of a selected value;
 (h) controlling the time of the arc current to a predetermined tolerance of an optimum value; and
 (i) said predetermined diameter being determined by controlling said arc current and said vortex flow.

19. The method of claim 18 wherein the arc is controlled to a tolerance of ±1% of the selected current value.

20. The method of claims 19 or 18 wherein the time is controlled to a tolerance of ±2% of the optimum value.

21. The method of claim 18 wherein the cathode and the anode are comprised of refractory metals.

22. The method of claim 18 wherein the fluid is a gas selected from the group consisting of nitrogen and the inert gas elements.

23. The method of claim 18 wherein the fluid chemically reacts with the materials to be removed.

24. The method of claim 18 wherein:
 (a) the anode is distinct from the article;
 (b) the arc is maintained without contacting the article; and
 (c) said gas vortex directed toward the article changes the material to be removed away from a solid physical state, with the vortex flow removing said material changed away from a solid physical state.

25. The method of claim 18 wherein the arc is initiated by impressing radio frequency current across the cathode and the anode.

26. The method of claim 18 wherein the arc is initiated by providing an initial high voltage between the cathode and the anode.

27. The method of claim 24 wherein said vortex surrounds the arc.

28. The method of claim 24 wherein the article is a composite of at least one insulator and at least one conductor.

29. The method of claim 18, wherein the article is single or multi layer requiring the milling of small precision holes.

* * * * *